United States Patent [19]

Turner

[11] Patent Number: 4,460,880
[45] Date of Patent: Jul. 17, 1984

[54] CIRCUIT MATCHING ELEMENTS

[75] Inventor: Brian Turner, Malvern Wells, England

[73] Assignee: The Secretary of State for Defence in Her Britannic Majesty's Government of the United Kingdom of Great Britain and Northern Ireland, London, England

[21] Appl. No.: 395,312

[22] Filed: Jul. 6, 1982

[30] Foreign Application Priority Data

Jul. 10, 1981 [GB] United Kingdom ............... 8121409

[51] Int. Cl.$^3$ ............................................. H01P 3/08
[52] U.S. Cl. ..................................... 333/238; 333/33; 333/247; 333/161
[58] Field of Search ............... 333/238, 116, 246, 247, 333/161, 33

[56] References Cited

U.S. PATENT DOCUMENTS 3,769,618 10/1973 Freedman et al. ................. 333/238
4,090,155 5/1978 Tateno et al. .................... 333/238 X
4,092,664 5/1978 Davis, Jr. ....................... 333/238 X
4,340,873 7/1982 Bastida ........................... 333/246 X

OTHER PUBLICATIONS

Caulton, M. and Sobol, H. "Microwave Integrated-Circuitry-A Survey", *IEEE Journal of Solid State Circuits*, vol. SC5, No. 6, (Dec. 1970), p. 299.

Primary Examiner—Paul L. Gensler
Assistant Examiner—Benny Lee
Attorney, Agent, or Firm—Cushman, Darby & Cushman

[57] ABSTRACT

The invention provides circuit matching elements primarily for integrated circuits and particularly for monolithic microwave integrated circuits.

A transmission line in accordance with the invention is provided with a thin metallic film deposition disposed in the signal propagation path. The effect of the film is to increase the specific capacitance of the line without decreasing the specific inductance. The result is a slowing down and therefore a decrease of the wavelength of signals in the line.

An example of an implementation of the invention is a coplanar waveguide having a central thick conducting line element (32) and outer thick conducting line elements (28,30) mounted on a substrate (21). The central element overlies a thin metallic film (22) which also underlies the outer conducting line elements and is insulated from the latter by polyamide insulation (24,26).

9 Claims, 8 Drawing Figures

CIRCUIT MATCHING ELEMENTS

BACKGROUND AND SUMMARY OF THE INVENTION

The invention concerns improvements in or relating to circuit matching elements and particularly, but not exclusively to electronic signal transmission lines for monolithic microwave integrated circuits (MMIC's).

In a typical monolithic integrated circuit for use at high frequencies, for example, in the microwave region, a large proportion of integrated circuit chip area is taken up by matching elements associated with the devices on the chip. Typically, of the order of ninety percent of the surface of a GaAs MMIC is accounted for by matching elements for the active GaAs devices. The fundamental working parts of the chip, mainly in the form of FET's therefore occupy only a minor fraction of the chip, the remainder being taken up by, for example, interconnections and dc bias lines.

Matching may be achieved in a number of ways.

According to a first such prior art technique used for GaAs MMIC's, little attempt is made to match reactive components, for example, the capacitive input to a GaAs FET, and unwanted reflections which may give rise to instabilities are absorbed in resistive loads. Use is made, however, of 'active' matching wherein the FET's design parameters, for instance $g_m$, the mutual conductance, are chosen appropriately.

This first matching technique is basically a low frequency technique in which advantage is taken of the high current gain of the GaAs FET at such frequencies. The method is not useful at higher frequencies where current gain approaches unity.

A second prior art method of matching uses lumped passive elements (inductors, capacitors and resistors) deposited on the chip to tune out reactive elements in active devices. FET input capacity may, for instance, be resonated with an inductor. At lower frequencies, this second technique has the disadvantage that some of the components may become inconveniently large.

This second method may be used at higher frequencies than the frequencies applicable to the first technique. However, as the frequency increases, the resonant circuit Q decreases due to increasing resistive losses in the matching components and the performance of the circuits is degraded.

A further complexity associated with this second method arises due to passive elements not being purely L, C or R components. Element/element interactions, for example magnetic coupling between inductors, must also be allowed for in the circuit design.

A third prior art matching method uses electromagnetic wave transmission lines. This may be achieved using microstrip techniques, a method particularly suited to GaAs MMIC since the rear face of the MMIC chip can conveniently be metallised to serve as a ground plane and may be bonded to a heat sink. However, via holes through the GaAs wafer are necessary to accommodate metallisation for connecting contacts on the upper wafer surface to the ground plane on the lower surface. This is a difficult procedure due, for example, to the need for front-to-back registration.

A means of overcoming the difficulties of microstrip is use of coplanar transmission lines. Using coplanar techniques implies no necessity for through-wafer connections. However, more space is taken up on the upper side of the wafer as more conductors are necessary here.

A disadvantage of prior art transmission lines is the relatively large quantity of space which they occupy. At 10 GHz a λ/4 transformer in air, for example, has a length of 7.5 mm.

It is to be noted that the wave velocity, v, in a propagation channel is given by:

$$v = 1/\sqrt{LC}$$

where
L = specific inductance and
C = specific capacitance
and the characteristic impedance, Z, given by:

$$Z = \sqrt{L/C}$$

The velocity and therefore the wavelength may be decreased by increasing C. Use of, for example, a mixed dielectric formed by air over a GaAs substrate in order to provide a higher C than a pure air dielectric without an associated change in L, gives a λ/4 transformer at 10 GHz of approximately 3 mm length. However, GaAs MMIC's realised using transmission lines in this way still result in a larger chip than those achieved using the first and second prior art methods described above.

A prior art method used to decrease the value of v involves inclusion of a thin layer of suitably doped semiconductor material in the transmission line structure. The thickness of the semiconductor layer is made much less than the skin depth, δ, of the propogating EM signals in the semiconductor material.

A prior art coplanar waveguide transmission line which includes such a thin layer of suitably doped semiconductor consists of a semi-insulating substrate overlayed by a thin n-doped semiconductor layer which itself is overlayed by an insulating layer over which the waveguide's thick conducting elements are formed. The losses in the waveguide thus formed are, however, difficult to eliminate due to the nature of its construction.

According to the present invention there is provided a transmission line for transmitting electronic signals including line conducting elements overlying at least one surface of a support substrate to define a signal propagation path wherein thin metallic film which has a thickness less than the skin depth of signals within the metallic film is disposed in the signal propagation path.

Preferably the thickness of the metallic film is less than 10% of the skin depth in order to increase the specific capacitance without reducing the specific inductance of the transmission line with respect to a transmission line which does not include metallic film.

The metallic film may be isolated from at least one conducting element by insulating material which may be either additional to or integral with the support substrate.

The transmission line may also include at least one semiconducting portion disposed in the signal propagation path.

The thin metallic film may be formed in either one or more than one area.

The transmission line may take the form of a coplanar waveguide with line conducting elements consisting of a central thick conducting strip lying between inner edges of two grounded thick conducting strips.

The coplanar waveguide may be constructed such that the thin metallic film directly underlies and is in electrical contact with at least one part of the central conducting strip, extending underneath and being insulated from the inner edges of the two grounded strips by a layer of insulating material having a high dielectric constant.

Alternatively, the coplanar waveguide may be constructed such that the thin metallic film directly underlies and is in electrical contact with the inner edges of the two grounded strips and extends underneath and is insulated from the central conducting strip. As a modification the central conducting strip may be formed on a semiconducting layer and insulation from the thin metallic film may be provided by a depletion region established within the semiconductor.

Alternatively, the coplanar waveguide may be constructed such that the thin metallic film is disposed in the area between the central conducting strip and the inner edges of the two grounded strips and is insulated from both the central conducting strip and the two grounded strips.

As a still further alternative of the transmission line may be fabricated in microstrip form, the line conducting elements consisting of a single conducting strip on a first surface of a non-conducting layer and a ground plane on the second surface of the non-conducting layer. The metallic film is then formed between the single conducting strip and the first surface of the non-conducting layer.

BRIEF DESCRIPTION OF THE ACCOMPANYING DRAWINGS

The invention will now be described by way of example only with reference to the accompanying diagrams consisting of:

FIG. 1 illustrating schematically an isometric view of a portion of a prior art coplanar waveguide on a semiconductor integrated circuit.

FIG. 2 showing a diagram of the circuit equivalent to the portion of waveguide of FIG. 1 for a quasi TEM made of propagation.

FIG. 3 illustrating schematically a cross section through a coplanar waveguide according to a first aspect of the invention.

FIG. 4 illustrating schematically a cross section through a slow wave microstrip structure according to a second aspect of the invention.

FIG. 5 illustrating schematically a cross section through a slow wave microstrip structure according to a third aspect of the invention.

FIG. 6 illustrating schematically a cross section through a slow wave microstrip structure according to a fourth aspect of the invention.

FIG. 7 illustrating schematically a cross section through a slow wave microstrip structure according to a fifth aspect of the invention.

FIG. 8 illustrating schematically a cross section through a slow wave microstrip structure according to a sixth aspect of the invention.

DETAILED DESCRIPTION OF THE PREFERRED EXEMPLARY EMBODIMENTS

Figure 1:
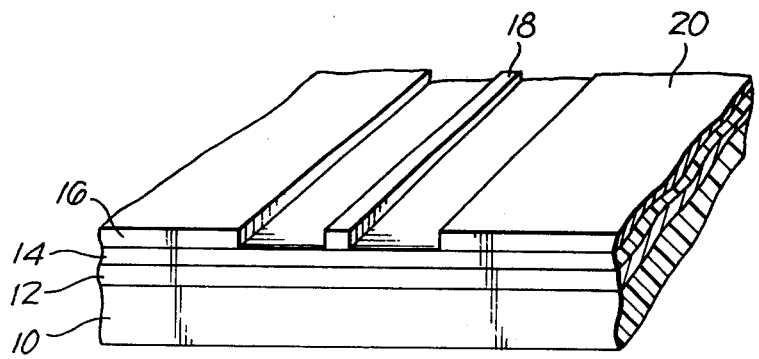

In the portion of waveguide of FIG. 1 a semi-insulating substrate layer, 10, of GaAs approximately 0.5 mm thick is covered on one of its surfaces by an n-type GaAs active semiconductor layer, 12, approximately 3 $\mu$m thick ie less than the skin depth of waves transmitted by the guide within the semiconductor material, 12.

The semiconductor layer, 12, is overlayed by an insulating layer, 14, of oxide of GaAs approximately 0.4 $\mu$m thick. Metal strips 16, 18 and 20 are then formed over the insulating layer, 14, to constitute transmission line conducting elements.

Figure 2:
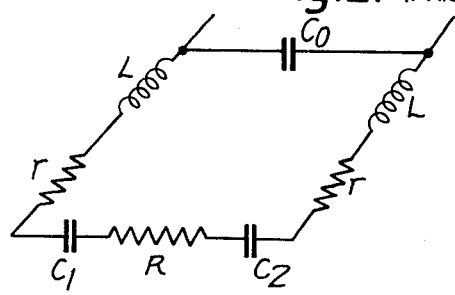

The circuit diagram of FIG. 2 depicts the equivalent circuit for the waveguide of FIG. 1 in a quasi TEM mode of operation. In FIG. 2 $C_o$ is the capacity attributable to the electric field lines in the upper half plane which is not shielded by the semiconductor layer, 12, and which is associated with the charge stored on the metal strips $C_1$ and $C_2$ are additional capacitances attributable to the insulating layer, 14, and R is the transverse resistance of the n-type semiconductor between the strips. Resistances r are due to the metal strips.

The losses in the circuit of FIG. 2 constitute a series component due to resistances, r, and a shunt component due to the necessity to charge capacitances $C_1$ and $C_2$ through resistance R. The effect on the component of the loss of the transmission line attributable to the series component, r, may be reduced by moving the metal strips further apart thereby increasing the inductance. However, increasing this separation increases the transverse resistance, R. The remaining parameters which may be varied to reduce the losses are the thickness and doping concentration of semiconductor layer, 12. However, for the requirement that the thickness of semiconductor layer 12, be substantially less than the skin depth, a limit is set as to how much these parameters may be increased.

At a given loss per wavelength, it may be shown that the extent to which the wave velocity may be reduced relative to propagation in vacuo is proportional to (conductivity of the semiconductor layer)$^{\frac{1}{4}}$. For example, with a GaAs semiconductor layer 1 $\mu$m thick doped with $10^{18}$ donors/cm$^3$, the predicted wavelength of a propagated signal at 8 GHz is approximately six times smaller than in vacuo at a relative loss of 0.5 dB/wavelength.

Figure 3:
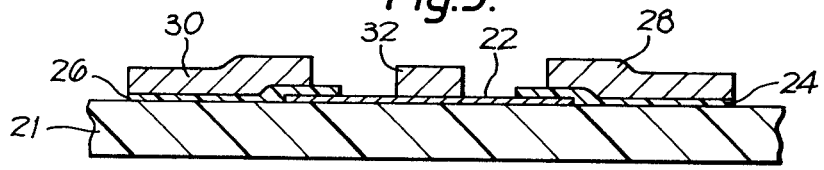

In FIG. 3 the inventive coplanar waveguide consists of a semi-insulating substrate of GaAs, 21, approximately 0.5 mm thick. A thin gold film, 22, 0.1 $\mu$m deep is formed on a surface of the substrate using an evaporate on/float off technique. Strips 24 and 26 of 2.5 $\mu$m thick polyamide are then formed over the surface of the GaAs and overlapping the edges of the gold film, 22. The polyamide is in the form of Dupont's PI 2555 which is spun on in solution cured and locally plasma ashed using a mask to give the desired geometry. Finally, thick metal strips 28 and 30 are formed over the polyamide strips 24 and 26 and a thick metal strip, 32, formed over the gold film, 22. The metal strips 28, 30 and 32 are formed by evaporation on/float off to define their geometries followed by plating up to a final thickness of 5 $\mu$m.

The central thick metal strip, 32, is made approximately 200 $\mu$m wide with the metal strips 28 and 30 approximately 700 $\mu$m (theoretically infinite) wide and separated from the central strip, 32, by approximately 200 $\mu$m. The thin gold film, 22, extends approximately 20 $\mu$m underneath the inner edges of strips 28 and 30.

The effect of the gold film on the operation of the waveguide may be understood by considering the following.

In general an electromagnetic wave established in a non-conducting region bounded by a conductor decays within the conductor as: $e^{-(x/\delta)}$ where x = perpendicular displacement into the conductor
δ = the skin depth
= $2/w\sigma\mu\mu_o^{\frac{1}{2}}$
where
σ = conductivity of the conductor
μ = relative permeability of the conductor
$\mu_o$ = permeability of free space
w = angular frequency of waves
Thus
δ = 0.87 μm for gold at 10 GHz.

Using the thickness of gold film as in the coplanar waveguide of FIG. 3, such a guide is useful in practice, bearing in mind the losses, for frequencies up to approximately 15 GHz.

The principle of operation of the coplanar waveguide of FIG. 3 is that the presence of a conducting layer thinner than δ has little effect on the magnetic field distribution of a propagating EM signal. The specific inductance of the waveguide is, therefore, governed by the thick metal strips which are thicker than the skin depth. By selecting the above thickness of gold film, this thin conductor has a low resistance and cannot therefore sustain a significant electric field. This perturbs the electric field distribution from that associated with signals propagating along thick conductors only. The effect of introducing the thin film conductor is to increase the specific capacitance of the transmission line without affecting the inductance thereby producing a line with reduced wave velocity and lower impedance. Predictions indicate that, for a waveguide configuration of the type in FIG. 3, the wavelength of a propagating EM signal is thirty times less than that in vacuo at a frequency of 8 GHz at a loss of 0.5 dB per wavelength.

Figure 4:
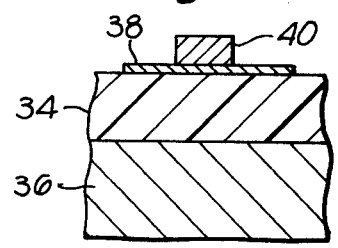

The same principles apply to the transmission line illustrated in FIG. 4 as to the waveguide of FIG. 3.

In FIG. 4 the line is in microstrip form and consists of a semi-insulating substrate of GaAs, 34, overlying a metal ground plane/heat sink, 36, which forms one of the transmission line conducting elements.

On the surface of the GaAs substrate opposite to the ground plane, a strip, 38, of gold film 0.1 μm thick is formed and a thick metallic conducting strip, 40, formed over the gold to constitute a second transmission line conducting element.

Figure 5:
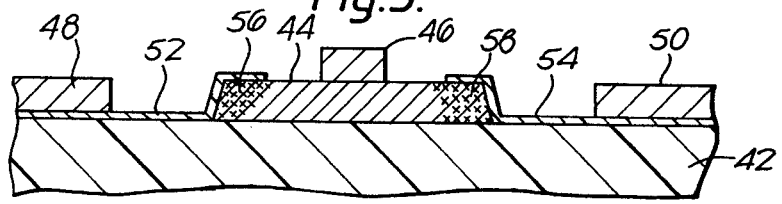

A modified form of the FIG. 3 coplanar waveguide is shown in FIG. 5. In the FIG. 5 device an n-doped GaAs means, 44, is formed on a semi-insulating GaAs substrate, 42. A thick metal strip, 46, is then formed on the mesa 44, an ohmic contact being provided between the metal and semiconductor by provision of a n+ doped region in the semiconductor at its interface with the metal. Thin gold film areas, 52 and 54 are then formed over the substrate, 42, and interfacing the edges of the mesa as shown. Thick metal strips 48 and 50 are then formed over the gold film areas 52 and 54 respectively. Schottky barrier contacts are formed at the interface between the thin gold film and the edges of the mesa, 44, and by suitable biasing, depletion regions 56 and 58 are formed beneath these contacts, thus providing insulation between the semiconductor, 44, and the gold film. Increased specific capacitance for the waveguide is thereby provided by the metal/insulator/semiconductor capacitors at the edges of the mesa, 44.

An advantage of the FIG. 5 device is that it is tunable by varying the voltage governing the depletion regions. Voltage-tunable phase shifters, for example, may be provided by such a device.

Figure 6:
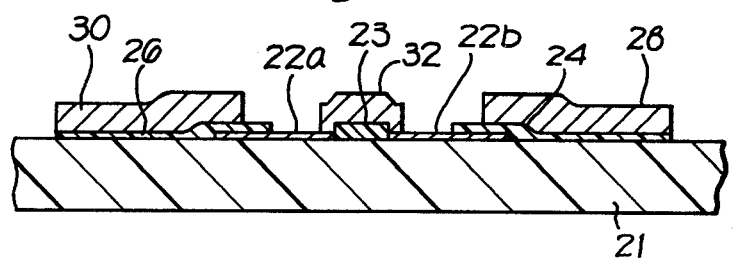

An equivalent structure to the coplanar waveguide of FIG. 3 is illustrated in FIG. 6 in which the thin gold film, 22, is formed in two separate areas shown at 22a and 22b in FIG. 6 and separated by a polyamide film, 23.

Figure 7:
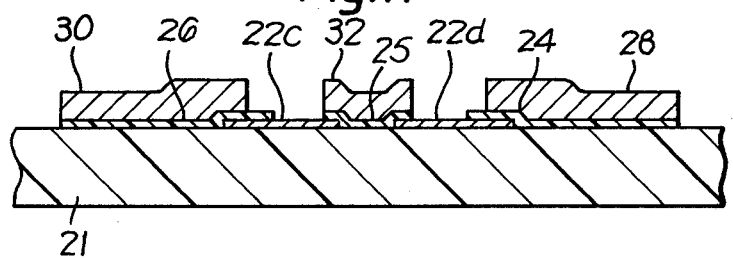

Another variation of the coplanar waveguide is illustrated in FIG. 7 in which the thin gold film is formed in two separate areas shown at 22c and 22d and in which the gold film is insulated from both the central metal strip, 32, by a polyamide layer, 25, and from the outer metal strips, 28 and 30 by polyamide layers 24 and 26 respectively.

Figure 8:
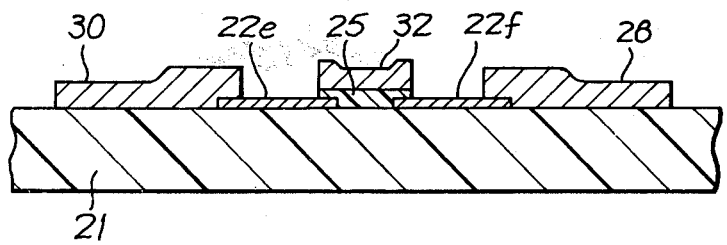

A further variation of the coplanar waveguide is illustrated in FIG. 8 in which the thin gold film is formed in two separate areas shown at 22e and 22f and in which the gold film is insulated from the central metal strip, 32, by polyamide layer 25 but is in electrical contact with the outer metal strips, 28 and 30.

The invention is not confined to the details disclosed in the above embodiments. The thin layer of metal may consist of material other than gold and may be formed in thicknesses other than 0.1 μm according to the frequency to be used in operation.

The insulating layer included in the waveguide configuration of FIGS. 3, 6, 7 and 8 may be other than polyamide. An oxide of GaAs may, for example, be used.

Although the embodiments have made reference to GaAs semiconductor devices, other forms of semiconductor may be used particularly, for example, InP at high frequencies.

I claim:

1. A slow wave transmission line for transmitting electronic signals comprising:
    a semi-insulating support substrate,
    line conducting elements overlying at least one surface of said support substrate to define a signal propagation path,
    and thin metallic film disposed in said signal propagation path,
    wherein said thin metallic film has a thickness which is less than the skin depth of said signals within said thin metallic film and is sufficiently thin to increase the specific capacitance of said transmission line without decreasing the specific inductance at the operating frequency of the line.

2. A transmission line as in claim 1 wherein said thin metallic film has a thickness less than 10% of the skin depth of the signals within said film.

3. A transmission line as in claim 1 wherein said thin metallic film is electrically isolated from all line conducting elements.

4. A transmission line as in claim 1 wherein said thin metallic film is formed in electrical contact with at least one line conducting element.

5. A transmission as in claim 1 wherein said line conducting elements are formed by a coplanar waveguide having a central conducting strip lying between outer conducting strips all of which strips are disposed on the same side of said substrate layer.

6. A transmission line as in claim 1 wherein said line conducting elements are provided by microstrip conductors consisting of a conducting strip overlying a first surface of said substrate which overlies a conducting ground plane.

7. A transmission line as in claim 5 wherein a semiconducting layer is included in the signal propagation path.

8. A transmission line as in claim 7 wherein said thin metallic film is insulated from said semiconducting layer by at least one depletion region in said semiconducting layer.

9. A transmission line as in claim 8 wherein said central conducting strip overlies a semiconducting strip and said thin metallic film is formed in two areas, each area being in contact with an outer conducting strip at one side and with a depletion region in said semiconducting strip at another side.

* * * * *